US007411515B2

(12) United States Patent
Giger et al.

(10) Patent No.: US 7,411,515 B2
(45) Date of Patent: Aug. 12, 2008

(54) REMOTE CONTROL WITH LOW BATTERY INDICATION

(75) Inventors: Robert John Giger, Mooresville, IN (US); Mark Gilmore Mears, Zionsville, IN (US); Roberto Montanez, Torreon (MX)

(73) Assignee: Thomson Licensing, Boulogne-Billancourt (FR)

( * ) Notice: Subject to any disclaimer, the term of this patent is extended or adjusted under 35 U.S.C. 154(b) by 8 days.

(21) Appl. No.: 10/512,317

(22) PCT Filed: Apr. 17, 2003

(86) PCT No.: PCT/US03/11874

§ 371 (c)(1),
(2), (4) Date: Oct. 22, 2004

(87) PCT Pub. No.: WO03/090178

PCT Pub. Date: Oct. 30, 2003

(65) Prior Publication Data

US 2005/0146438 A1  Jul. 7, 2005

Related U.S. Application Data

(60) Provisional application No. 60/374,535, filed on Apr. 22, 2002.

(51) Int. Cl.
*G08B 21/00* (2006.01)
(52) U.S. Cl. .............. 340/636.19; 340/636.1; 340/825.62; 320/134; 320/136; 362/233; 362/529; 324/430
(58) Field of Classification Search .............. 340/636.1, 340/636.12, 636.15, 636.19, 825.69, 825.62, 340/825.72, 660, 661, 662, 663; 320/134, 320/136; 362/533, 529
See application file for complete search history.

(56) References Cited

U.S. PATENT DOCUMENTS

| 4,578,671 | A |   | 3/1986 | Flowers |
|-----------|---|---|--------|---------|
| 4,649,373 | A |   | 3/1987 | Bland et al. |
| 4,959,810 | A |   | 9/1990 | Darbee et al. |
| 5,506,572 | A |   | 4/1996 | Hills et al. |
| 5,543,776 | A | * | 8/1996 | L'Esperance et al. .. 340/426.25 |

(Continued)

FOREIGN PATENT DOCUMENTS

DE            2805896           8/1979

(Continued)

OTHER PUBLICATIONS

Search Report Dated Sep. 10, 2003.

*Primary Examiner*—Jeffery Hofsass
*Assistant Examiner*—Edny Labbees
(74) *Attorney, Agent, or Firm*—Joseph J. Laks; Robert D. Shedd; Reitseng Lin

(57) ABSTRACT

The invention is a method and remote control apparatus for controlling an electronic device that is capable of indicating a low battery state without the need for cooperation with the electronic device. In one aspect, the invention is a remote control apparatus for controlling an electronic device comprising: a power supply having a voltage; and means to activate an indicator, wherein the activation means activates the indicator in the first way when the voltage is at or above a predefined threshold and the activation means activates the indicator in the second way when the voltage is below a predefined threshold.

17 Claims, 2 Drawing Sheets

U.S. PATENT DOCUMENTS

| | | | |
|---|---|---|---|
| 5,583,491 A | 12/1996 | Kim | |
| 5,684,471 A | 11/1997 | Bernardi et al. | |
| 5,796,334 A * | 8/1998 | Chen et al. | 340/636.1 |
| 6,098,175 A | 8/2000 | Lee | |
| 6,353,800 B1 | 3/2002 | Rector | |
| 6,794,992 B1 * | 9/2004 | Rogers | 340/825.25 |
| 2003/0012563 A1 * | 1/2003 | Neugebauer et al. | 392/365 |
| 2004/0235446 A1 * | 11/2004 | Flaherty et al. | 455/352 |
| 2006/0017581 A1 * | 1/2006 | Schwendinger et al. | 340/636.1 |

FOREIGN PATENT DOCUMENTS

| | | | |
|---|---|---|---|
| EP | 0358478 | | 3/1990 |
| JP | 11-154878 | | 6/1999 |
| JP | 11-1154878 | * | 6/1999 |

\* cited by examiner

REMOTE CONTROL WITH LOW BATTERY INDICATION

CROSS-REFERENCE TO RELATED APPLICATIONS

This application claims the benefit, under 35 U.S.C. § 365 of International Application PCT/US03/11874, filed Apr. 17, 2003, which was published in accordance with PCT Article 21(2) on Oct. 30, 2003 in English and which claims the benefit of U.S. Provisional Patent Application No. 60/374,535, filed Apr. 22, 2002.

TECHNICAL FIELD OF INVENTION

This invention relates generally to the field of remote controls for controlling electronic devices, and specifically to apparatus and methods for indicating when the batteries/power source for such remote controls is low.

BACKGROUND ART

Remote control devices are used to control electronic devices such as televisions, video cassette recorders, digital versatile disc players, stereos, digital recorders, cable boxes, etc. Most remote controls are wireless and have an internal energy source such as a battery to provide the necessary power to the remote control device. Wireless capability allows a user to control the desired electronic device from almost anywhere in a room and without having to be in physical contact with the device. As the capabilities, functionality, and complexity of electronic devices have increased over the years, so has the dependency of the user on the remote control.

Through the use of processors and programming, a single remote control, known as a universal remote control, can be used to control a plurality of electronic devices. The increased capabilities and applications of remote controls have resulted in an increased use of the internal power source, e.g., batteries, of the remote control. In some cases, the voltage of the batteries may be decreased to a point where the remote control either operates poorly and/or stops working completely. This is undesirable not only because the user loses the ability to control electronic devices without physical interaction, but also because the user's programming that is saved within a volatile memory of the remote control, for example, programming multiple universal devices and learned codes, will be lost. However, if the batteries are replaced before the voltage level of the batteries get too low, these problems can be avoided.

While many remote controls will drain their batteries to an undesirably low level without giving any indication to the user, a number of methods and apparatus have been developed to alert the user that the batteries must be replaced. For example, some remote controls will send a special "Low Voltage Display" remote hexcode to the electronic device it is being used to control. In response to this hexcode, the electronic device will display a message, such as "BATTERIES ARE LOW—REPLACE THEM SOON" on its display screen. A disadvantage of this technique is that it requires co-ordination of the remote control and the electronic device. Thus, if the electronic device does not have a display screen or is not capable of deciphering the hexcode, the message will not be displayed to the user. Moreover, this coordination between remote control and electronic device cannot be implemented if the remote control is sold as a replacement for an original remote control of a different brand and/or having different compatibility requirements.

Other remote controls have a specially dedicated light emitting diode ("LED") that will light up when a key is pressed and the voltage of the batteries is below a certain level. Specially dedicated LED's are located on the remote control itself and do not require cooperation with the electronic device in order to alert the user of a low voltage status of the battery. However, specially dedicated LED's increase the cost of the remote, take up additional space on the remote control face, and use additional voltage from the batteries. Moreover, some remote controls have replaced the specially dedicated LED with a liquid crystal display ("LCD") for displaying a low battery icon. These remote controls not only suffer from the same deficiencies as the LED remotes but also form the additional problem that LCD's are even more expensive.

Thus, a need exists for a remote control that can alert the user that it is in a low battery without using requiring a specially designated indicator and/or requiring cooperation with an electronic device.

DISCLOSURE OF THE INVENTION

It is an object of the present invention to provide a method and remote control apparatus that can alert a user of a low voltage state.

Another object of the present invention is to provide a method and remote control apparatus that can alert a user of a low voltage state without the need for cooperation with an electronic device.

Yet another object of the present invention is to provide a method and remote control apparatus that can alert a user of a low voltage state without using a specially designated indicator, such as an LED or an LCD icon.

Still another object of the of the present invention is to provide a method and remote control apparatus that can alert a user of a low voltage state while conserving the remaining voltage of the power source.

A further object of the present invention is to provide a method and remote control apparatus that can alert a user of a low voltage state while performing standard functions.

A still further object of the of the present invention is to provide a method and remote control apparatus that can alert a user of a low voltage state by modifying the behavior of an existing feature.

A yet further object is to provide a more cost effective method and remote control apparatus that can alert a user of a low voltage state.

These objects, and others which will become apparent from the following disclosure and drawings, are addressed by the present invention which comprises in one aspect a remote control apparatus for controlling an electronic device comprising: a power supply having a voltage; a user input mechanism; an indicator; wherein when the user input mechanism is activated and the voltage is at or above a predefined threshold, the indicator is activated in a first way; and wherein when the user input mechanism is activated and the voltage is below the predefined threshold, the indicator is activated in a second way.

It is preferable that the remote control apparatus further comprises means to determine whether the voltage is above or below the predefined threshold. Preferably the same indicator is used for two purposes, for example a backlight can illuminate the keys whenever any key is pressed in a first way, and then the same backlight can illuminate the keys in a second way whenever any key is pressed and the batteries are low.

The user will observe the backlight being illuminated in the second way and will know that the batteries need replacing. The instructions, for example, may tell the user that the backlight being illuminated in the second way means the batteries are low.

It is further preferable that the indicator be a backlight source and that activating the backlight source in the first way comprises illuminating the backlight source for a first predetermined time and wherein activating the backlight source in the second way comprises illuminating the backlight source for a second predetermined time. By making the first predetermined time longer than the second predetermined time, the voltage of the power source can be conserved. Alternatively, activating the backlight source in the second way can comprise flashing the backlight source for a third predetermined time.

The predefined threshold can be at or about approximately 0.2 volts and the user input mechanism can be a backlight key, channel key, a volume key, a number key, a power key, or a mute key.

In an alternative embodiment, the indicator can comprise a plurality of backlight LED's. In this embodiment, it is preferable that activating the plurality of backlight LED's in the first way comprise illuminating a first number of the backlight LED's and wherein activating the plurality of backlight LED's in the second way comprises illuminating a second number of the backlight LED's. The power source can be a battery.

In another aspect, the invention is a method for indicating when a power source of a remote control apparatus is in a low voltage state comprising: providing an indicator on the remote control apparatus; determining a voltage of the power source; upon a user input mechanism being activated, activating the indicator in a first way when the voltage is at or above a predefined threshhold; and upon the user input mechanism being activated, activating the indicator in a second way when the voltage is below a predefined threshhold.

The inventive method preferably comprises the further step of transmitting a signal to an electronic device indicating that the voltage is at or below the predefined threshold. The remote control apparatus used to carry out the inventive method preferably comprises the hardware, and functions, as described above in relation to the remote control apparatus of the present invention.

In yet another aspect the invention is a remote control apparatus for controlling an electronic device comprising: a power supply having a voltage; and means to activate an indicator, wherein the activation means activates the indicator in the first way when the voltage is at or above a predefined threshold and the activation means activates the indicator in the second way when the voltage is below a predefined threshold.

MODES FOR CARRYING OUT THE INVENTION

It is not uncommon for current remote controls to have a backlight which, when activated, illuminates the user keys of the remote control for a predetermined period of time, typically about 6 seconds, referred to herein as "the first way." The backlight is activated by a user pressing either any key or a dedicated backlight key on the remote control. The backlight illumination allows the user to more easily operate the remote control in poor lighting conditions. In the illustrated embodiment, when a user presses the backlight key when the batteries are in a low voltage state (defined by a threshold voltage), instead of the backlight being illuminated for 6 seconds, the backlight will only be illuminated for 1 second, "the second way." The user can easily recognize when the batteries need to be changed before the operability of the remote control is compromised and/or lost when the backlighting illuminates the second way upon pressing any remote key.

Figure 1:
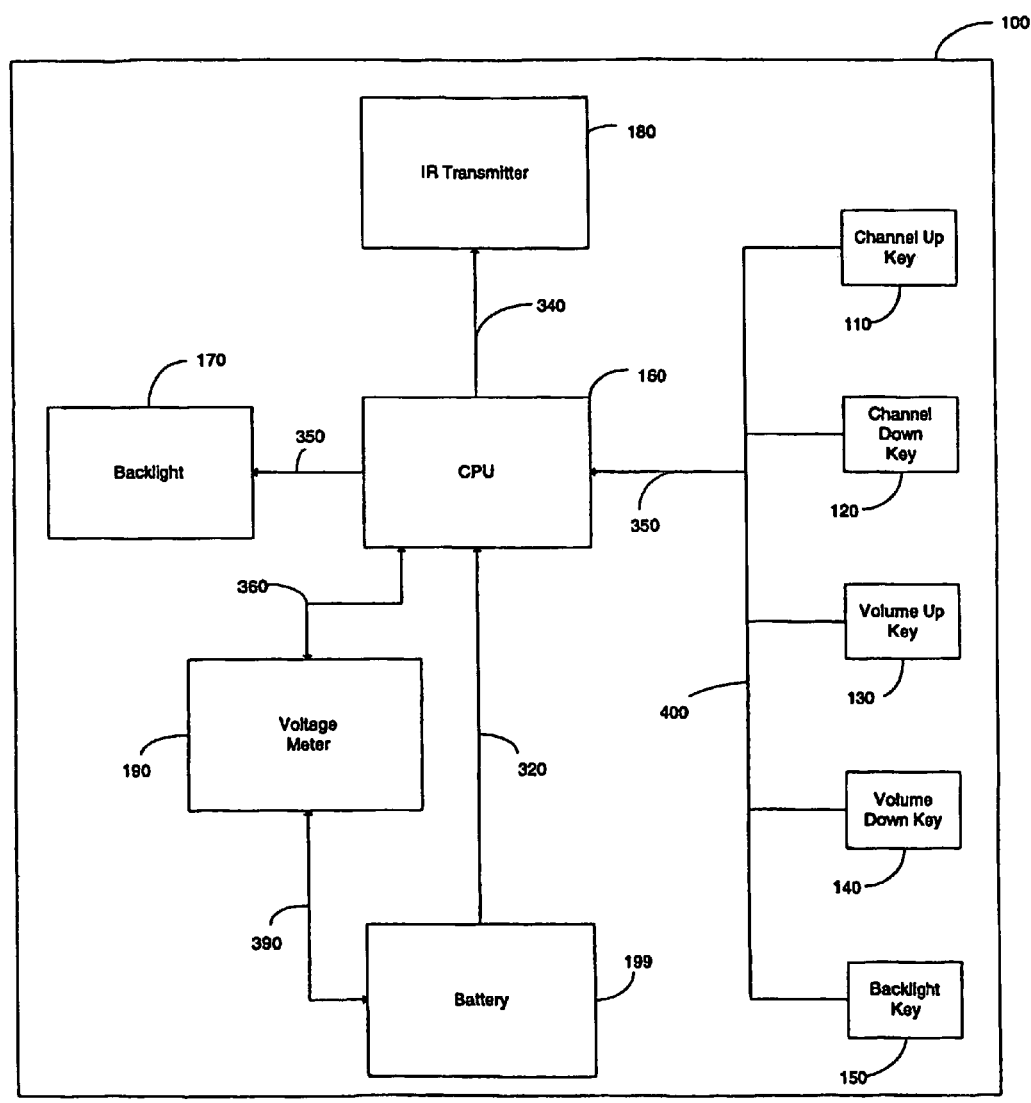
FIG. 1 is a schematic of a remote control apparatus according to the present invention.

Referring to FIG. 1, remote control 100, an exemplary embodiment of the present invention is schematically illustrated. Remote control 100 comprises a plurality of user input keys, namely channel up key 110, channel down key 120, volume up key 130, volume down key 140, and backlight key 150. These five user input keys are illustrated for exemplary purpose only, those skilled in the art will appreciate that remote control 100 can comprise numerous other user input keys such as a power key, a mute key, or a plurality of number keys. When a user presses one of the user input keys 110–150, CPU 160 receives a corresponding signal via bus 400. CPU 160 is programmed so that upon receipt of a signal from user input keys 110–150, it will carry out the desired function.

Remote control 100 further comprises CPU 160, backlight 170, infrared ("IR") transmitter 180, voltage meter 190, and battery 199. Remotes having other types of transmitters, for example radio frequency ("RF"), can be used. Battery 199 can be any conventional single battery or a plurality of batteries in combination. Battery 199 acts as a power source for CPU 160 and provides the energy necessary for remote control 100 to function via connection 320. Battery 199 has a voltage that starts at a certain level and gradually decreases as it is used.

Voltage meter 190 is operably coupled to battery 199 and CPU 160. Through programming, voltage meter 190 is adapted to monitor and/or measure the voltage level of battery 199 and communicate this voltage level to CPU 160 for evaluation. CPU 160 is also operably coupled to backlight 170 and IR transmitter 180. CPU 160 can activate/deactivate backlight 170. In an actual embodiment, backlight 170 is positioned behind transparent or translucent user input keys of remote control 100. Backlight 170 can be a backlight LED or a plurality of backlight LED's. Other types of backlighting can be used, for example electroluminescent panels. When activated, backlight 170 is illuminated, causing the user input keys to appear to be illuminated. CPU 160 can also activate/use IR transmitter 180 to send signals to an electronic device. IR transmitter 180 is adapted to send control signals corresponding to user inputs to an IR sensor on the electronic device (not illustrated).

Figure 2:
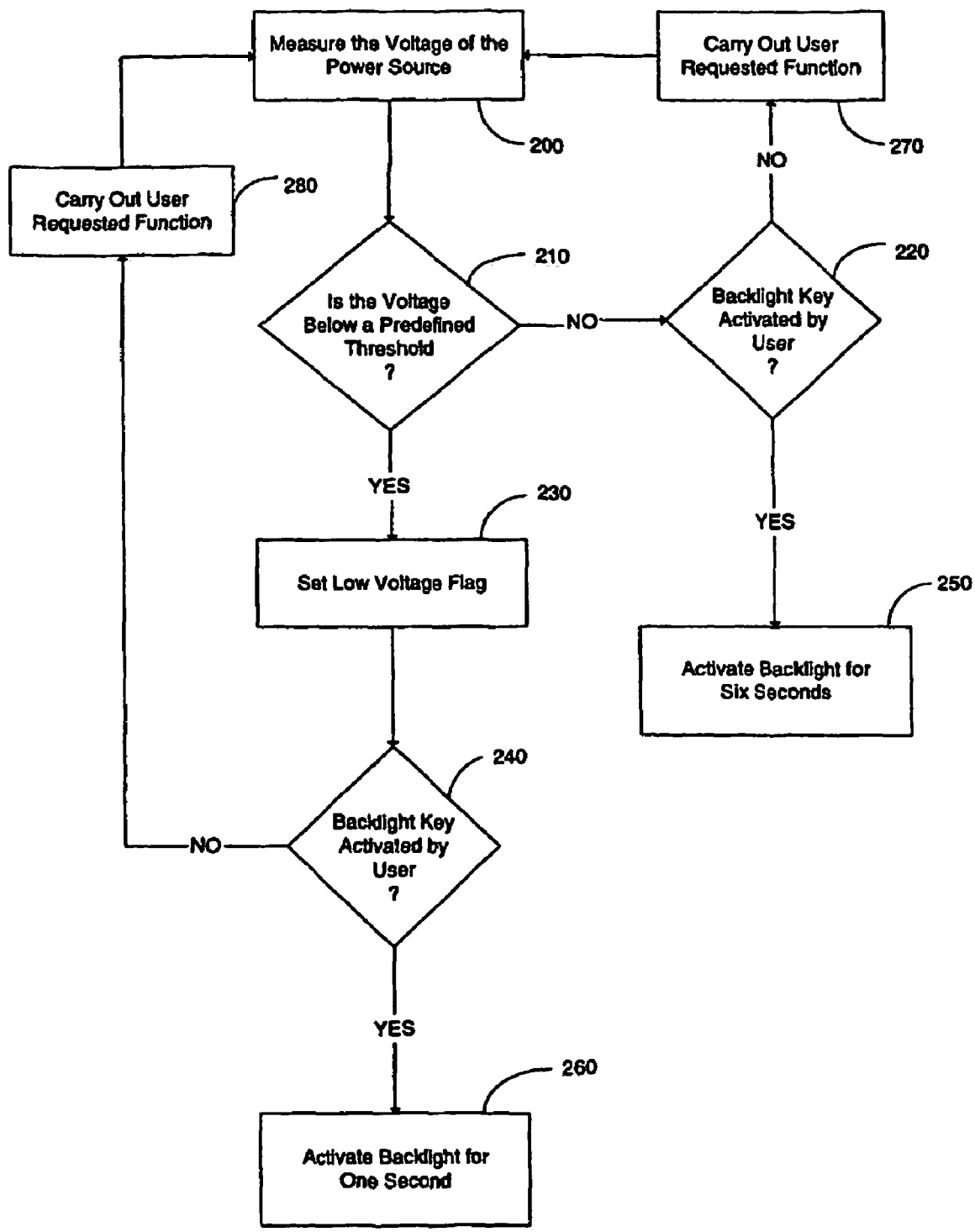
FIG. 2 is flowchart diagram of a method for indicating when a power source of a remote control apparatus is in a low voltage state according to the present invention.

FIG. 2 is a flowchart diagram of an embodiment of a method for indicating when battery 199 of remote control 100 is in a low voltage state according to the present invention. The inventive method of FIG. 2 will be discussed in relation to the hardware of FIG. 1.

Starting at process block 200, voltage meter 190 monitors and/or measures the voltage of battery 199 via connection 390. Alternatively, voltage meter 190 can be adapted to measure the output voltage of battery 199 along connection 320 rather than the voltage of the battery itself Voltage meter 190 can also be positioned in series between battery 199 and CPU 160. CPU 160 can be programmed so that the voltage measuring function of voltage meter 190 is initiated upon a user entering a command by pressing one of user input keys 110–150. Alternatively, CPU 160 can be programmed to initiate the voltage measuring function of voltage meter 190 at set intervals of time or continuously.

Once the voltage of battery 199 is measured, voltage meter 190 communicates the voltage reading to CPU 160 via connection 360. CPU 160 is programmed to analyze the incoming voltage reading data and compare it to a predefined threshold voltage. When the voltage of battery 199 is at or above the predefined threshold, battery 199 can provide enough electrical energy to remote control 100 so that operability is not compromised. However, if the voltage of battery 199 is below the predefined threshold, battery 199 is substantially drained. If battery 199 continues to be used after its voltage falls below the predefined threshold, the operability of remote control 100 will soon be compromised. For exemplary purposes, the predefined threshold can be 0.2 volts.

Once CPU 160 receives the voltage reading data, decision block 210 is executed by CPU 160. CPU 160 compares the voltage reading data received from voltage meter 190 to the predefined threshold voltage stored in CPU 160, in this case 0.2 volts. If the voltage reading data indicates that the voltage of battery 199 is at or above 0.2 volts, the answer to decision block 210 is NO and CPU 160 proceeds to decision block 220. At decision block 220, CPU 160 analyzes the user input signal received from bus 400 via connection 350 to determine what key 110-150 was activated by the user. If backlight key 150 was activated, the answer to decision block 220 is YES and CPU 160 send a signal to backlight 170 via connection 350, causing backlight 170 to illuminate for a normal duration, e.g., six seconds. However, if backlight key 150 was not pressed, i.e., a different key was pressed, the answer to decision block 220 is NO. CPU 160 will then proceed to process block 270 and carry out the user requested function.

If at decision block 210, the voltage reading data indicates that the voltage of battery 199 is below 0.2 volts, the answer to decision block 210 is YES. CPU 160 is programmed to then proceed to process block 230 and set a low-voltage flag in the software. Once the low voltage flag is set, CPU 160 proceeds to decision block 240. At decision block 240, CPU 160 analyzes the user input signal received from bus 400 via connection 350 to determine what key 110-150 was activated by the user. If backlight key 150 was activated, the answer to decision block 240 is YES and CPU 160 send a signal to backlight 170 via connection 350, causing backlight 170 to illuminate for a shortened duration, e.g., one second. This one-second flash of backlight 170 is an indication to the user that battery 190 needs to be replaced in remote control 100. The shortened duration of illumination of backlight 170 also acts to conserve the energy of battery 190 by reducing the draining of battery 190.

If backlight key 150 was not pressed, i.e., a different key was pressed, the answer to decision block 240 is NO and CPU 160 will proceed to process block 280. At process block 280, CPU 160 will carry out the appropriate user requested function.

The invention can be alternatively be configured so that backlight 170 is illuminated for one second not only when the user activates backlight key 150 but also when any user input key is pressed on a remote control. In another alternative implementation of the present invention, backlight 170 can be a plurality of LED's positioned on remote control 100. In this embodiment, CPU 160 can be programmed to only light up one of the LED's when the battery level is low instead of all of the LED's as normal. Also in this embodiment, when CPU 160 can be programmed to light up the LED's in a sequence when the battery level is low instead of all of the LED's being illuminated simultaneously as normal. In another embodiment, the backlight illuminates in the first way whenever any key is pressed and the voltage is above the predetermined threshold, and in the second way when any key is pressed when the voltage is below the predetermined threshold.

Remote control 100 can also be adapted to also have the ability to send out the a Low Voltage Display ("LVD") IR hexcode signal via IR transmitter 180 to the electronic device in addition to the backlighting features described above, which causes a pop up message or icon in the on-screen display ("OSD") to signify that the remote battery voltage is low. This can be accomplished by properly programming CPU 160. The backlight can also be used as a feedback indication when programming the remote rather than having a dedicated LED for programming mode feedback.

While the invention and preferred embodiments have been described and illustrated in sufficient detail that those skilled in this art may readily make and use the invention, various alternatives, modifications and improvements should become readily apparent to this skilled in this art without departing from the spirit and scope of the invention.

The invention claimed is:

1. A remote control apparatus for controlling an electronic device, the remote control apparatus comprising:
   a power supply having a voltage;
   a user input mechanism;
   a backlight source;
   a processor operatively coupled to the power supply, the user input mechanism and the backlight source and being operative to detect the voltage;
   wherein if the user input mechanism is activated and the detected voltage is at or above a predefined threshold, the processor causes the backlight source to illuminate for a first predetermined time; and
   wherein if the user input mechanism is activated and the detected voltage is below the predefined threshold, the processor causes the backlight source to illuminate for a second predetermined time.

2. The remote control apparatus of claim 1 further comprising means to measure the voltage and provide a corresponding voltage reading to the processor.

3. The remote control apparatus of claim 1 further comprising means to transmit signals to the electronic device.

4. The remote control apparatus of claim 3 wherein the transmission means is adapted to transmit a signal to the electronic device indicating that the voltage is at or below the predefined threshold when the user input mechanism is activated.

5. The remote control apparatus of claim 1 wherein the first predetermined time is longer than the second predetermined time.

6. The remote control apparatus of claim 1 wherein when the user input mechanism is activated and the voltage is below the predefined threshold the backlight source is activated to flash for a third predetermined time.

7. The remote control apparatus of claim 1 wherein the predefined threshold is at or about approximately 0.2 volts.

8. The remote control apparatus of claim 1 wherein the user input mechanism is selected from the group consisting of a backlight key, channel key, a volume key, a number key, a power key, and a mute key.

9. The remote control apparatus of claim 1 wherein the power source is a battery.

10. The remote control apparatus of claim 1 wherein the voltage is an output voltage.

11. The remote control apparatus of claim 1 further comprising:
   means to measure the voltage and provide a corresponding voltage reading to the processor;

means to transmit a signal to the electronic device indicating that the voltage is at or below the predefined threshold when the user input mechanism is activated; and wherein the power source comprises a battery and the user input mechanism comprises a backlight key.

12. A method for indicating when a power source of a remote control apparatus is in a low voltage state comprising:

providing a backlight source on the remote control apparatus;

using a processor of the remote control apparatus to detect a voltage of the power source;

upon a user input mechanism of the remote control apparatus being activated, the processor causing the backlight source to illuminate for a first predetermined time if the detected voltage is at or above a predefined threshold; and upon the user input mechanism being activated, the processor causing the backlight source to illuminate for a second predetermined time if the detected voltage is below the predefined threshold.

13. The method of claim 12 further comprising transmitting a signal to an electronic device indicating that the voltage is at or below the predefined threshold.

14. The method of claim 12 wherein when the user input mechanism is activated and the voltage is below the predefined threshold the backlight source is activated to flash for a third predetermined time.

15. The method of claim 12 wherein the user input mechanism is selected from the group consisting of a backlight key, channel key, a volume key, a number key, a power key, and a mute key.

16. A method for indicating when a power source of a remote control apparatus is in a low voltage state comprising:

providing a plurality of backlight elements on the remote control apparatus;

using a processor of the remote control apparatus to detect a voltage of the power source;

upon a user input mechanism of the remote control apparatus being activated, the processor causing the backlight elements to illuminate for a first time period if the detected voltage is at or above a predefined threshold; and upon the user input mechanism being activated, the processor causing the backlight elements to illuminate for a second time period if the detected voltage is below the predefined threshold.

17. A remote control apparatus for controlling an electronic device, the remote control apparatus comprising:

a power supply having a voltage;

illumination means for providing an illumination;

control means for detecting the voltage and controlling the illumination means responsive to the detection; and wherein the control means causes the illumination means to illuminate for a first predetermined time if the detected voltage is at or above a predefined threshold and causes the illumination means to illuminate for a second predetermined time if the detected voltage is below the predefined threshold.

* * * * *